(12) United States Patent
Zhang et al.

(10) Patent No.: US 11,290,001 B2
(45) Date of Patent: Mar. 29, 2022

(54) POWER SUPPLY DEVICE

(71) Applicant: TOSHIBA MITSUBISHI-ELECTRIC INDUSTRIAL SYSTEMS CORPORATION, Chuo-ku (JP)

(72) Inventors: Xiaochen Zhang, Chuo-ku (JP); Toshihide Nakano, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 17/052,711

(22) PCT Filed: Mar. 5, 2019

(86) PCT No.: PCT/JP2019/008534
§ 371 (c)(1),
(2) Date: Nov. 3, 2020

(87) PCT Pub. No.: WO2020/178969
PCT Pub. Date: Sep. 10, 2020

(65) Prior Publication Data
US 2021/0242770 A1 Aug. 5, 2021

(51) Int. Cl.
*H02M 1/34* (2007.01)
*H02J 9/06* (2006.01)
(Continued)

(52) U.S. Cl.
CPC .................. *H02M 1/34* (2013.01); *H02J 9/06* (2013.01); *H02M 3/33584* (2013.01); *H03K 17/16* (2013.01); *H03K 17/567* (2013.01)

(58) Field of Classification Search
CPC .... H02M 1/34; H02M 3/33584; H02M 3/325; H02M 3/33507; H02M 1/08;
(Continued)

(56) References Cited

U.S. PATENT DOCUMENTS

| 10,734,987 B2* | 8/2020 | Solomko .............. H03K 17/063 |
| 2021/0057997 A1* | 2/2021 | Zhang ............... H02M 3/33584 |
| 2021/0273549 A1* | 9/2021 | Nakano ................. H02M 7/217 |

FOREIGN PATENT DOCUMENTS

| JP | 2-230814 A | 9/1990 |
| JP | 2000-49581 A | 2/2000 |

(Continued)

OTHER PUBLICATIONS

International Search Report dated May 7, 2019 in PCT/JP2019/008534 filed Mar. 5, 2019.

(Continued)

*Primary Examiner* — Adolf D Berhane
(74) *Attorney, Agent, or Firm* — Oblon, McClelland, Maier & Neustadt, L.L.P.

(57) ABSTRACT

The uninterruptible power supply device includes a switch (2) that includes first to Nth IGBT units (U1 to UN) connected in series, and a controller that turns on the switch by turning on the first to Nth IGBT units, and turns off the switch by firstly turning off the first to nth IGBT units and then turning off the (n+1)th to Nth IGBT units. Compared with the case where the first to Nth IGBT units are turned off at the same time, it is possible to reduce a surge voltage generated between the terminals of the switch (2).

10 Claims, 9 Drawing Sheets

(51) Int. Cl.
*H02M 3/335* (2006.01)
*H03K 17/16* (2006.01)
*H03K 17/567* (2006.01)

(58) Field of Classification Search
CPC ........ H02M 1/0003; H02J 9/06; H03K 17/16; H03K 17/567; H03K 17/687
See application file for complete search history.

(56) References Cited

FOREIGN PATENT DOCUMENTS

| | | |
|---|---|---|
| JP | 2007-97261 A | 4/2007 |
| JP | 2017-60317 A | 3/2017 |

OTHER PUBLICATIONS

Notice of Reasons for Refusal dated Jan. 5, 2021 in Japanese Patent Application No. 2019/538280 (with English machine translation), 6 pages.
Examination report dated Dec. 10, 2021 in corresponding Indian Patent Application No. 202017052159 (5 pages).

* cited by examiner

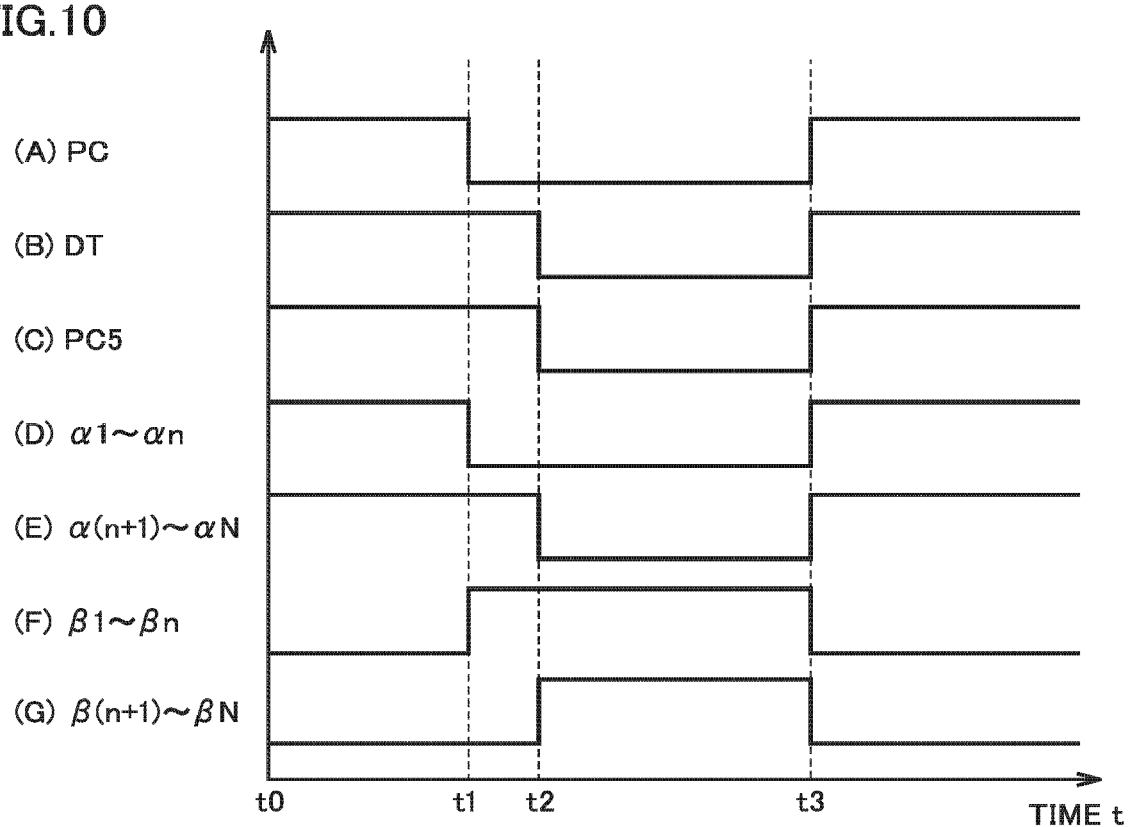

POWER SUPPLY DEVICE

TECHNICAL FIELD

The present invention relates to a power supply device, and more particularly to a power supply device equipped with a switch that includes a plurality of switching elements connected in series.

BACKGROUND ART

For example, Japanese Patent Laying-Open No. 2007-97261 (PTL 1) discloses a switch that includes a plurality of switching elements connected in series. Further, Japanese Patent Laying-Open No. H2-230814 (PTL 2), for example, discloses a method for preventing a surge voltage from being generated at current interruption by turning off the switch at the zero point of an alternating current.

CITATION LIST

Patent Literature

PTL 1: Japanese Patent Laying-Open No. 2007-97261
PTL 2: Japanese Patent Laying-Open No. H2-230814

SUMMARY OF INVENTION

Technical Problem

However, in PTL 1, when the plurality of switching elements are turned off, a surge voltage is generated between the electrodes of each switching element, and thereby a large surge voltage is generated between the terminals of the switch.

In PTL 2, it is necessary to wait until the alternating current flowing through the switch reaches the zero point, which makes it impossible to quickly turn off the switch.

Therefore, the main object of the present invention is to provide a power supply device capable of reducing a surge voltage generated between terminals of a switch and capable of quickly turning off the switch.

Solution to Problem

The power supply device according to the present invention includes a switch including a plurality of switching elements that are connected in series between a first terminal and a second terminal and are divided into a first group and a second group, and a controller that turns on the switch by turning on the plurality of switching elements, and turns off the switch by firstly turning off the switching elements in the first group and then turning off the switching elements in the second group.

Advantageous Effects of Invention

In the power supply device according to the present invention, the plurality of switching elements are divided into a first group and a second group. When turning off the switch, the switching elements in the first group are firstly turned off, and then the switching elements in the second group are turned off. Compared with the case where the plurality of switching elements are turned off at the same time, it is possible to reduce the surge voltage generated between the terminals of the switch. Moreover, since it is not necessary to wait until the alternating current flowing through the switch reaches the zero point, it is possible to quickly turn off the switch.

BRIEF DESCRIPTION OF DRAWINGS

FIG. 10 is a time chart illustrating the operation of the control unit illustrated in FIG. 9.

DESCRIPTION OF EMBODIMENTS

First Embodiment

Figure 1:
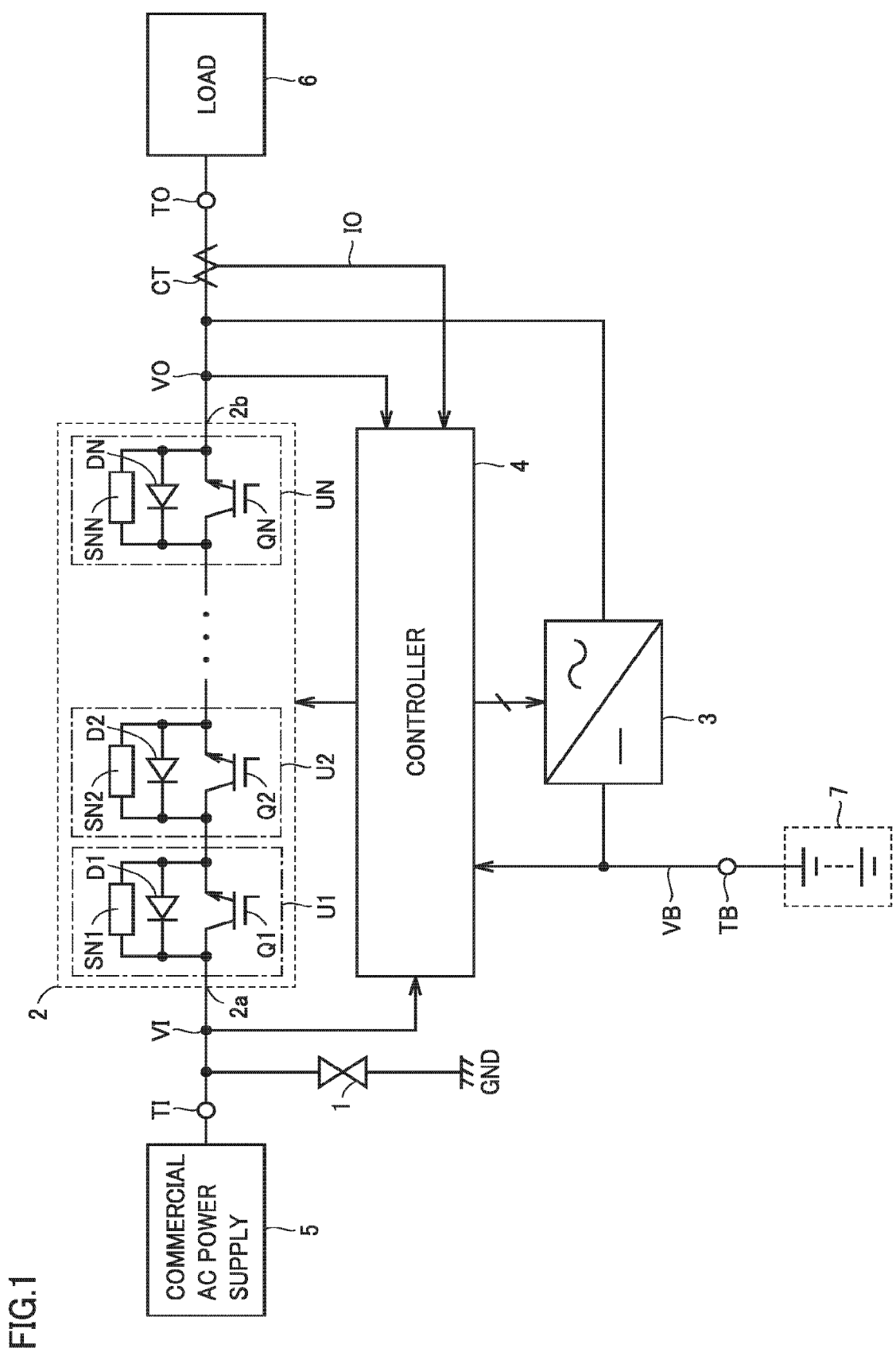
FIG. 1 is a circuit block diagram illustrating the configuration of an uninterruptible power supply device according to a first embodiment.

FIG. 1 is a circuit block diagram illustrating the configuration of an uninterruptible power supply device according to a first embodiment. The uninterruptible power supply device is designed to supply three-phase AC power to a load, but for the purpose of simplifying the drawing and the description, only the components related to one phase are illustrated in FIG. 1. This uninterruptible power supply device is also called a multiple power compensator.

In FIG. 1, the uninterruptible power supply device includes an AC input terminal TI, an AC output terminal TO, a battery terminal TB, a surge absorber 1, a switch 2, a current detector CT, a bidirectional converter 3, and a controller 4.

The AC input terminal TI receives an AC voltage VI having a commercial frequency from a commercial AC power supply 5. The instantaneous value of the AC voltage VI is detected by the controller 4. The controller 4 determines whether or not the AC voltage VI is normally supplied from the commercial AC power supply 5 based on the instantaneous value of the AC voltage VI.

For example, the controller 4 determines that the AC voltage VI is normally supplied when the AC voltage VI is higher than a lower limit voltage. On the other hand, the controller 4 determines that the AC voltage VI is not normally supplied when the AC voltage VI is smaller than the lower limit voltage.

The AC output terminal TO is connected to a load 6. The load 6 is driven by the AC power supplied from the uninterruptible power supply device. The instantaneous value of an AC output voltage VO at the AC output terminal TO is detected by the controller 4.

The battery terminal TB is connected to a battery 7 (power storage device). The battery 7 stores DC power. A capacitor may be used to replace the battery 7. The instantaneous value of a voltage VB between terminals of the battery 7 is detected by the controller 4.

The surge absorber 1 is connected between the AC input terminal TI and a ground line GND so as to protect the uninterruptible power supply device and the commercial AC power supply 5 from a surge voltage generated at the AC input terminal TI. For example, when a lightning strikes the power transmission lines of the commercial AC power supply 5 or when the switch 2 is turned off from the on state, a surge voltage is generated at the AC input terminal TI.

When the voltage at the AC input terminal TI is equal to or lower than a predetermined limit voltage VL1, the surge absorber 1 has a high resistance value. However, when the voltage at the AC input terminal TI becomes greater than the limit voltage VL1, the resistance value of the surge absorber 1 decreases rapidly, and a current flows from the AC input terminal TI into the ground line GND via the surge absorber 1. Therefore, the voltage at the AC input terminal TI should be kept equal to or lower than the limit voltage VL1 so as to protect the uninterruptible power supply device and the commercial AC power supply 5 from the surge voltage.

The switch 2 has one terminal 2a connected to the AC input terminal TI and the other terminal 2b connected to the AC output terminal TO. The switch 2 includes N IGBT (Insulated Gate Bipolar Transistor) units U1 to UN connected in series between one terminal 2a and the other terminal 2b. N is a natural number of 2 or more. For example, N=7. The IGBT units U1 to UN correspond to an example of a "semiconductor switch".

Each of the IGBT units U1 to UN is represented by an IGBT unit Ui (where i is a natural number of 1 or more and N or less). The IGBT unit Ui includes an IGBT Qi, a diode Di connected in anti-parallel to the IGBT Qi, and a snubber circuit SNi. The collector of the IGBT Qi is electrically connected to one terminal 2a, and the emitter thereof is electrically connected to the other terminal 2b. The diode Di is connected in a forward direction from the other terminal 2b toward one terminal 2a.

Figure 2:
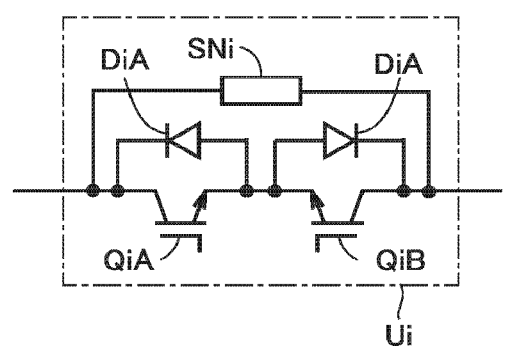
FIG. 2 is a circuit diagram illustrating another configuration of an IGBT unit illustrated in FIG. 1.

Note that the IGBT unit Ui is not limited to the configuration illustrated in FIG. 1, it may have the configuration illustrated in FIG. 2, for example. In the example of FIG. 2, the IGBT unit Ui includes IGBTs QiA and QiB connected in anti-series, diodes DiA and DiB connected in anti-parallel to the IGBTs QiA and QiB, respectively, and a snubber circuit SNi. The collector of the IGBT QiA is electrically connected to one terminal 2a, and the emitter thereof is electrically connected to the emitter of the IGBT QiB. The collector of the IGBT QiB is electrically connected to the other terminal 2b. The diode DiA is connected in the forward direction from the other terminal 2b toward the one terminal 2a. The diode DiB is connected in the forward direction from the other terminal 2b toward the one terminal 2a. The snubber circuit SNi is connected in parallel to the series circuit of the IGBTs QiA and QiB.

The IGBT units U1 to UN are divided in advance into a first group and a second group. For example, the IGBT units U1 to Un are divided into the first group, and the IGBT units U(n+1) to UN are divided into the second group. n is a natural number smaller than N. For example, N=7 and n=4. The setting of N and n will be described hereinafter.

When the AC voltage VI is normally supplied from the commercial AC power supply 5 (i.e., when the commercial AC power supply 5 is healthy), the switch 2 is turned on. When the AC voltage VI is not normally supplied from the commercial AC power supply 5 (i.e., when the commercial AC power supply 5 is failed), the switch 2 is turned off. The switch 2 is controlled by the controller 4.

When turning on the switch 2 from the off state, the controller 4 turns on the IGBT units U1 to UN at the same time. On the other hand, when turning off the switch 2 from the on state, the controller 4 firstly turns off the IGBT units U1 to Un in the first group and then turns off the IGBT units U(n+1) to UN in the second group. This reduces the surge voltage generated at the AC input terminal TI when the switch 2 is turned off.

The diodes D1 to DN are connected in anti-parallel to the IGBTs Q1 to QN, respectively. Each of the diodes D1 to DN is a freewheel diode. The snubber circuits SN1 to SNN are connected in parallel to the IGBTs Q1 to QN, respectively, so as to protect each of the IGBTs Q1 to QN from the surge voltage.

Each of the snubber circuits SN1 to SNN includes a resistor such as ZnR (zinc oxide nonlinear resistor) whose resistance value is voltage-dependent. The resistance value of the resistor changes in response to the voltage between its terminals, and drops quickly when the voltage exceeds a predetermined limit voltage VL2. The limit voltage VL2 (for example, 5400V) for each of the snubber circuits SN1 to SNN is set to be equal to or lower than a withstand voltage (for example, 6000V) for each of the IGBT units U1 to UN. Therefore, in the example of FIG. 1, the collector-emitter voltage for each of the IGBTs Q1 to QN is limited to the withstand voltage or less so as to prevent each of the IGBTs Q1 to QN from being destroyed by the surge voltage.

The current detector CT detects an instantaneous value of an alternating current (load current) IO flowing from the other terminal 2b of the switch 2 into the AC output terminal TO, and sends a signal indicating the detected value to the controller 4.

The bidirectional converter 3 is connected between the other terminal 2b of the switch 2 and the battery terminal TB, and is controlled by the controller 4. The bidirectional converter 3 converts the AC power supplied from the commercial AC power supply 5 via the switch 2 into DC power and stores the DC power in the battery 7 when the commercial AC power supply 5 is healthy. At this time, the controller 4 controls the bidirectional converter 3 so that the voltage VB between the terminals of the battery 7 is equal to a reference voltage VBr.

On the other hand, when the commercial AC power supply 5 is failed, the bidirectional converter 3 converts the DC power from the battery 7 into AC power having a commercial frequency and supplies the AC power to the load 6. At this time, the controller 4 controls the bidirectional converter 3 based on the AC output voltage VO and the AC output current IO so that the AC output voltage VO is equal to a reference voltage VOr. When the voltage VB between the terminals of the battery 7 drops to the lower limit voltage, the controller 4 stops the operation of the bidirectional converter 3.

Next, the operation of the uninterruptible power supply device will be described. When the commercial AC power supply 5 is healthy, the switch 2 is turned on, the AC power is supplied from the commercial AC power supply 5 via the switch 2 to the load 6 so as to drive the load 6. In addition, the AC power is supplied from the commercial AC power supply 5 via the switch 2 to the bidirectional converter 3 in which the AC power is converted into DC power and stored in the battery 7.

When the commercial AC power supply 5 is failed, the switch 2 is instantaneously turned off, and the DC power of the battery 7 is converted into AC power by the bidirectional converter 3 and supplied to the load 6. Therefore, even when a power failure occurs, as long as the battery 7 is stored with DC power, the operation of the load 6 can be continued.

Next, the setting of the value of N will be described. Assume that the effective value of the line voltage of the commercial AC power supply 5 is 10 kV which may fluctuate by ±1 kV, then the max peak value of the phase voltage VI is 11 kV×√2÷√3≅9 kV. When the switch 2 is turned off and the phase of the AC input voltage VI and the phase of the AC output voltage VO are shifted by 180 degrees, the voltage between the terminals of the switch 2 is maximum, that is 9 kV×2=18 kV.

When the switch 2 is turned off, an alternating current flows through each of the snubber circuits SN1 to SNN. When a current larger than a predetermined reference current (for example, 1 mA) flows through the snubber circuits SN1 to SNN, heat is generated in the snubber circuits SN1 to SNN, which shortens the service life of the snubber circuits SN1 to SNN. Therefore, it is necessary to set the value of N so as to make the current flowing through the snubber circuit less than or equal to the reference current.

When the reference current flows through the snubber circuit, the voltage generated between the terminals of the snubber circuit is set as a long-term withstand voltage of the snubber circuit. If the long-term withstand voltage for each of the snubber circuits SN1 to SNN is 3 kV, then the minimum value of N is 18 kV÷3 kV=6. If the redundancy number is 1, then N=6+1=7. Therefore, the number of the snubber circuits is 7, and the number of the IGBT units is also 7.

If the instantaneous withstand voltage for each of the IGBT units U1 to U7 is 6.1 kV, then the instantaneous withstand voltage of the switch 2 is 6.1 kV×7=42.7 kV. In this case, even if the maximum voltage (18 kV) is applied between the terminals of the switch 2, the switch 2 will not be damaged. However, if the IGBT units U1 to UN are turned off at the same time when a power failure occurs, a large surge voltage is generated between the terminals of the switch 2, which may shorten the service life of the surge absorber 1.

In other words, assuming that when an IGBT unit that is flowing with a rated current is turned off, the surge voltage (the voltage is determined by the limit voltage VL2 of the snubber circuit) generated between the collector and the emitter of the IGBT unit is 5 kV. If the IGBT units U1 to U7 flowing with the rated current are turned off at the same time, the surge voltage generated between the terminals of the switch 2 will be 5 kV×7=35 kV. When the maximum value of the AC output voltage VO is 9 kV, the voltage between the terminals of the surge absorber 1 (FIG. 1) is 9 kV+35 kV=44 kV.

This surge voltage (44 kV) is absorbed by the surge absorber 1. The greater the surge voltage absorbed by the surge absorber 1 is, the shorter the service life of the surge absorber 1 will be. If the surge voltage of 44 kV is absorbed twice, the surge absorber 1 will be damaged. If the surge absorber 1 is damaged, it is required to replace the damaged surge absorber 1 with a new one, which increases the maintenance cost of the uninterruptible power supply device. Therefore, it is necessary to reduce the surge voltage generated between the terminals of the switch 2 as small as possible.

Next, the setting of the value of n will be described. Assuming that the instantaneous withstand voltage of the IGBT is 6.1 kV, then the minimum value of n is 18 kV÷6.1 kV≅3. If the redundancy number is 1, then n=3+1=4. In other words, at the time of turning off the switch 2, it is not necessary to turn off all the IGBT units U1 to U7 at the same time, and it is sufficient to turn off only the IGBT units U1 to U4. Therefore, in the first embodiment, at the time of turning off the switch 2, the IGBT units U1 to U4 are firstly turned off, and then the remaining IGBT units U5 to U7 are turned off.

Assuming that when an IGBT unit that is flowing with a rated current is turned off, the surge voltage generated between the collector and emitter of the IGBT unit is 5 kV. If the IGBT units U1 to U4 flowing with the rated current are turned off, the surge voltage generated between the terminals of the switch 2 will be 5 kV×4=20 kV. When the maximum value of the AC output voltage VO is 9 kV, the voltage between the terminals of the surge absorber 1 (FIG. 1) is 9 kV+20 kV=29 kV.

This surge voltage (29 kV) is absorbed by the surge absorber 1. The smaller the surge voltage absorbed by the surge absorber 1 is, the longer the service life of the surge absorber 1 will be. Even if the surge voltage of 29 kV was absorbed by the surge absorber 1 for several tens of times, the surge absorber 1 was not damaged.

Figure 3:
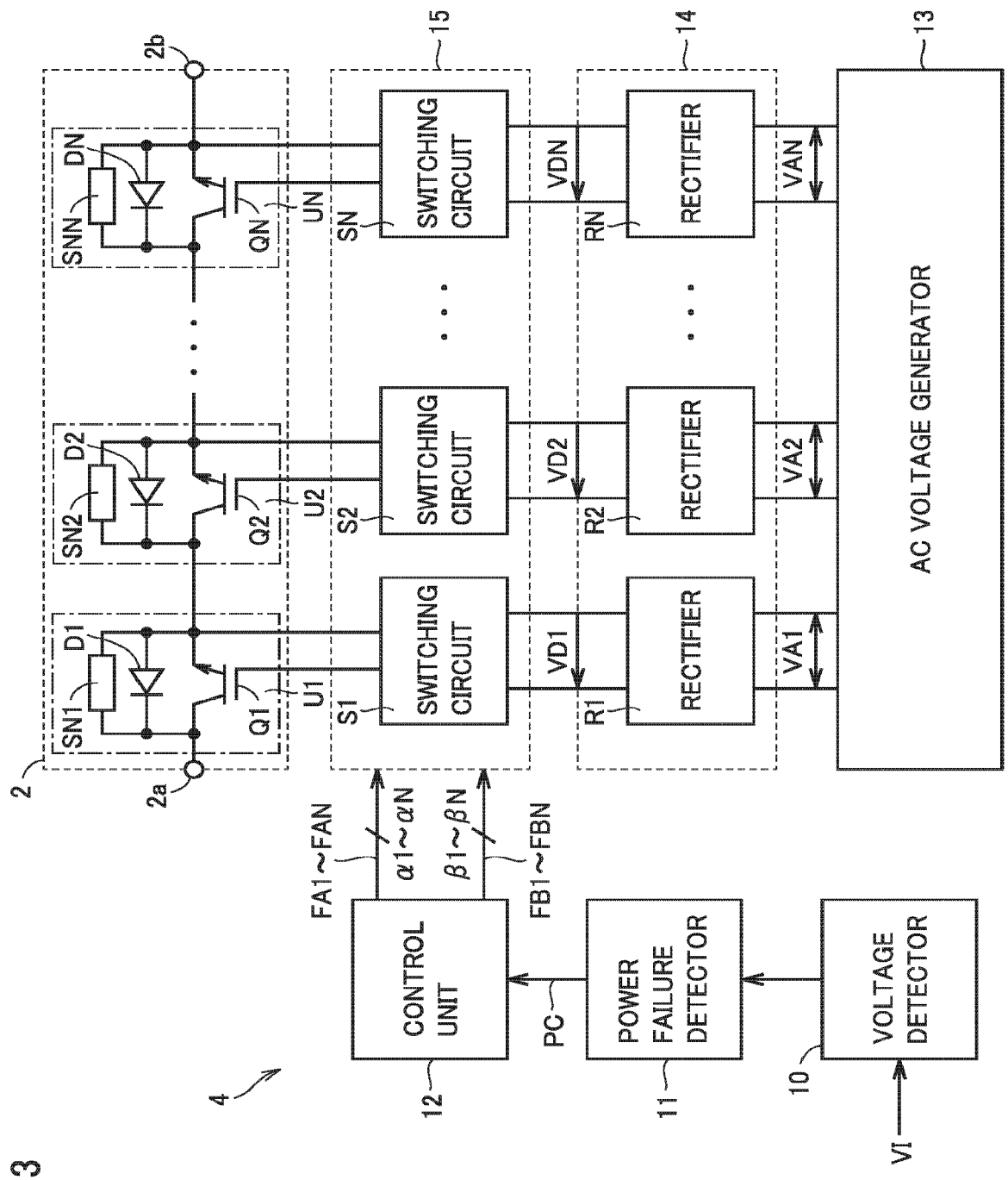
FIG. 3 is a circuit block diagram illustrating the configuration of a part of a controller illustrated in FIG. 1 responsible for controlling a switch.

FIG. 3 is a circuit block diagram illustrating the configuration of a part of the controller 4 illustrated in FIG. 1 responsible for controlling the switch 2. As illustrated in FIG. 3, the controller 4 includes a voltage detector 10, a power failure detector 11, a control unit 12, optical fibers FA1 to FAN and FB1 to FBN, an AC voltage generator 13, a DC voltage generator 14, and a driver 15.

The voltage detector 10 detects an instantaneous value of the AC voltage VI supplied from the commercial AC power supply 5 (FIG. 1), and outputs a signal indicating the detected value. The power failure detector 11 determines whether or the commercial AC power supply 5 is healthy based on the signal output from the voltage detector 10, and outputs a signal PC indicating the determination result.

When the AC voltage VI is higher than the lower limit voltage, it is determined that the commercial AC power supply 5 is healthy, and the signal PC is set to the "H" level. When the AC voltage VI is lower than the lower limit voltage, it is determined that the commercial AC power supply 5 is not healthy, and the signal PC is set to the "L" level.

The control unit 12 outputs optical signals α1 to αN and β1 to βN in response to the signal PC. The optical signals α1 to αN are supplied to the driver 15 via the optical fibers FA1 to FAN, respectively, and the optical signals β1 to βN are supplied to the driver 15 via the optical fibers FB1 to FBN, respectively. The driver 15 turns on the IGBT units U1 to UN in response to the optical signals α1 to αN, and turns off the IGBT units U1 to UN in response to the optical signals β1 to βN.

When the signal PC is set to the "H" level, the control unit 12 outputs the optical signals α1 to αN and stops outputting the optical signals β1 to βN so as to turn on the IGBT units U1 to UN. When the signal PC is set to the "L" level, the control unit 12 stops outputting the optical signals α1 to αn and outputs the optical signals β1 to βn so as to turn off the IGBT units U1 to Un, and after a predetermined time Td, the control unit 12 stops outputting the optical signals α(n+1) to αN and outputs the optical signals β(n+1) to βN so as to turn off the IGBT units U(n+1) to UN. The predetermined time Td is set to a sufficient long duration required to turn off the IGBT units U1 to Un from the on state.

Figure 4:
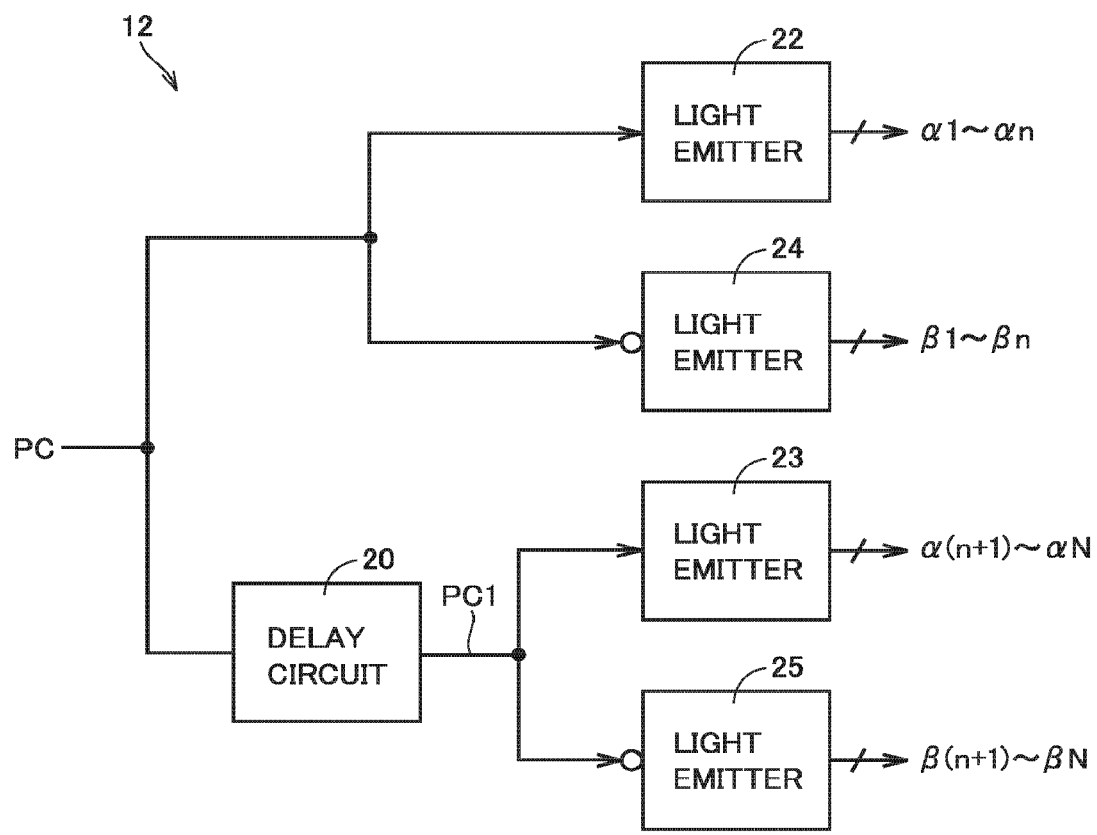
FIG. 4 is a circuit block diagram illustrating the configuration of a control unit illustrated in FIG. 3.

FIG. 4 is a block diagram illustrating the configuration of the control unit 12 (FIG. 3). As illustrated in FIG. 4, the control unit 12 includes a delay circuit 20 and light emitters 22 to 25. The signal PC output from the power failure detector 11 is supplied to the light emitters 22, 24 and the delay circuit 20.

Figure 5:
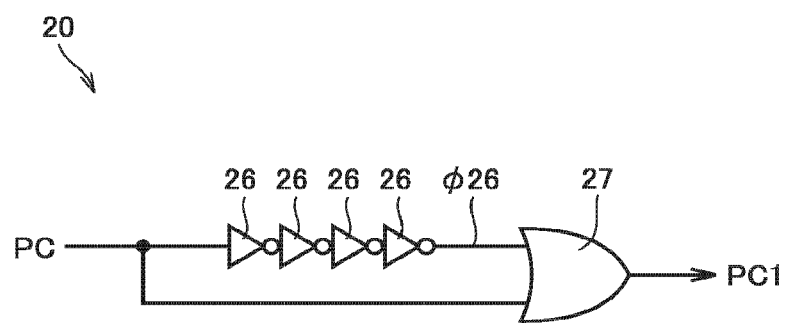
FIG. 5 is a circuit diagram illustrating the configuration of a delay circuit illustrated in FIG. 4.

As illustrated in FIG. 5, the delay circuit 20 includes an even number of stages (four stages in FIG. 5) of inverters 26 connected in series and an OR gate 27. The signal PC is supplied to one input node of the OR gate 27 via the even number of inverters 26 and directly supplied to the other input node of the OR gate 27.

When the signal PC is at the "H" level, the signal PC1 output from the OR gate 27 is at the "H" level, and the signal $\varphi 26$ output from the inverter 26 of the final stage is also at the "H" level. When the signal PC falls to the "L" level due to the occurrence of a power failure, after the delay time Td of the even-numbered inverters 26 has elapsed, the signal $\varphi 26$ falls to the "L" level, and the signal PC1 falls to the "L" level. Note that when the commercial AC power supply 5 is restored to the healthy state and the signal PC rises to the "H" level, the signal PC1 will rise to the "H" level immediately.

In other words, the delay circuit 20 generates the signal PC1 by passing the rising edge of the signal PC but delaying the falling edge of the signal PC by the predetermined time Td.

Referring back to FIG. 4, the signal PC1 output from the delay circuit 20 is supplied to the light emitters 23 and 25. The light emitter 22 outputs optical signals $\alpha 1$ to $\alpha n$ when the signal PC is at the "H" level, and stops outputting the optical signals $\alpha 1$ to $\alpha n$ when the signal PC is at the "L" level. The light emitter 23 outputs optical signals $\alpha(n+1)$ to $\alpha N$ when the signal PC1 output from the delay circuit 20 is at "H" level, and stops outputting the optical signals $\alpha(n+1)$ to $\alpha N$ when the signal PC1 is at the "L" level.

The light emitter 24 outputs optical signals $\beta 1$ to $\beta n$ when the signal PC is at the "L" level, and stops outputting the optical signals $\beta 1$ to $\beta n$ when the signal PC is at the "H" level. The light emitter 25 outputs optical signals $\beta(n+1)$ to $\beta N$ when the signal PC1 output from the delay circuit 20 is at the "L" level, and stops outputting the optical signals $\beta(n+1)$ to $\beta N$ when the signal PC1 is at the "H" level.

Figure 6:
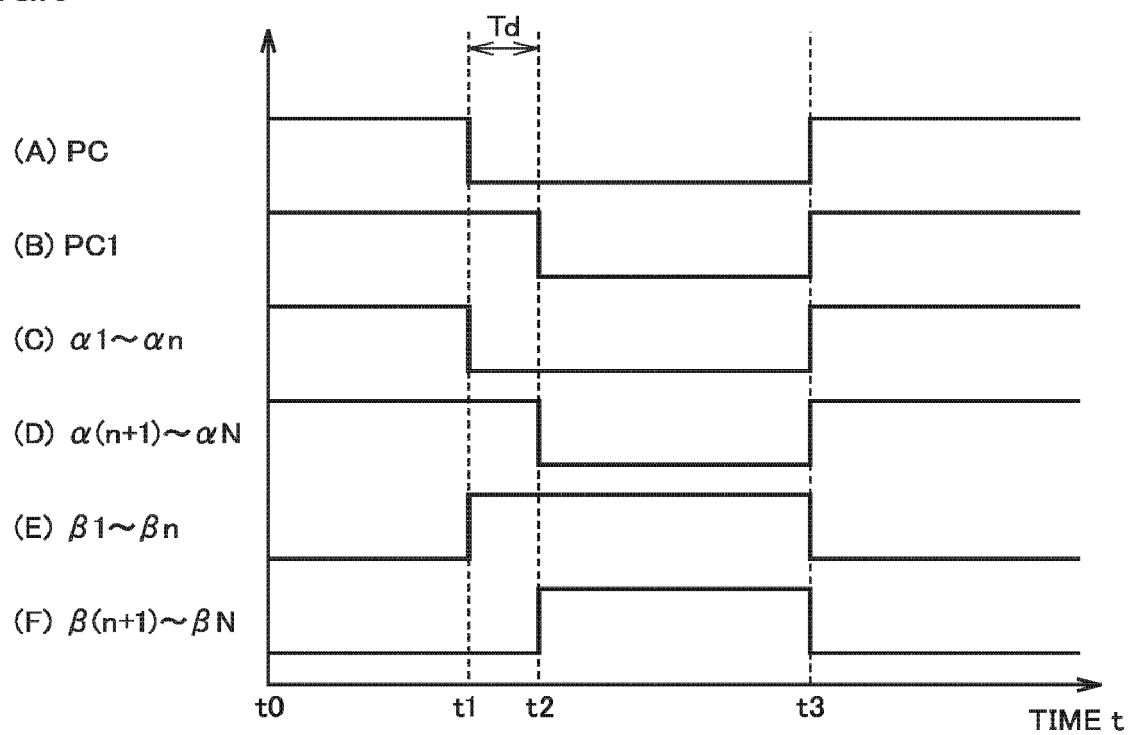
FIG. 6 is a time chart illustrating the operation of the control unit illustrated in FIG. 4.

FIG. 6 illustrates a time chart denoting the operation of the control unit 12 illustrated in FIG. 4. Specifically, FIG. 6(A) illustrates the waveform of the signal PC output from the power failure detector 11 (FIG. 3), and FIG. 6(B) illustrates the waveform of the signal PC1 output from the delay circuit 20 (FIG. 4).

FIG. 6(C) illustrates the waveform of the optical signals $\alpha 1$ to $\alpha n$ output from the light emitter 22 (FIG. 4), and FIG. 6(D) illustrates the waveform of the optical signals $\alpha(n+1)$ to $\alpha N$ output from the light emitter 23 (FIG. 4). FIG. 6(E) illustrates the waveform of the optical signals $\beta 1$ to $\beta n$ output from the light emitter 24 (FIG. 4), and FIG. 6(F) illustrates the waveform of the optical signals $\beta(n+1)$ to $\beta N$ output from the light emitter 25 (FIG. 4).

As illustrated in FIG. 6, at timing t0, the AC voltage VI is normally supplied from the commercial AC power supply 5, and the signal PC is set to the "H" level. In this case, the optical signals $\alpha 1$ to $\alpha N$ are output from the light emitters 22 and 23, and the output of the optical signals $\beta 1$ to $\beta N$ from the light emitters 24 and 25 is stopped, whereby the IGBT units U1 to UN are turned on.

When a power failure occurs at timing t1, the signal PC falls from the "H" level to the "L" level, the output of the optical signals $\alpha 1$ to $\alpha n$ from the light emitter 22 is stopped, and the optical signals $\beta 1$ to $\beta n$ are output from the light emitter 24, whereby the IGBT units U1 to Un are turned off.

At timing t2 after the predetermined time Td has elapsed from timing t1, the signals PC and PC1 both fall from the "H" level to the "L" level. As a result, the output of the optical signals $\alpha(n+1)$ to $\alpha N$ from the light emitter 23 is stopped, and the optical signals $\beta(n+1)$ to $\beta N$ are output from the light emitter 25, whereby the IGBT units U(n+1) to UN are turned off.

Next, when the commercial AC power supply 5 is restored to the healthy state at timing t3, the signals PC and PC1 both rise from the "L" level to the "H" level. As a result, the optical signals $\alpha 1$ to $\alpha N$ are output from the light emitters 22 and 23, the output of the optical signals $\beta 1$ to $\beta N$ from the light emitters 24 and 25 is stopped, whereby the IGBT units U1 to UN are turned on.

Referring back to FIG. 3, the AC voltage generator 13 outputs N AC voltages VA1 to VAN. The magnitudes (for example, the effective values) of the AC voltages VA1 to VAN are the same, for example, 200V. The DC voltage generator 14 converts the AC voltages VA1 to VAN into DC voltages VD1 to VDN, respectively. The magnitudes of the DC voltages VD1 to VDN are the same.

Figure 7:
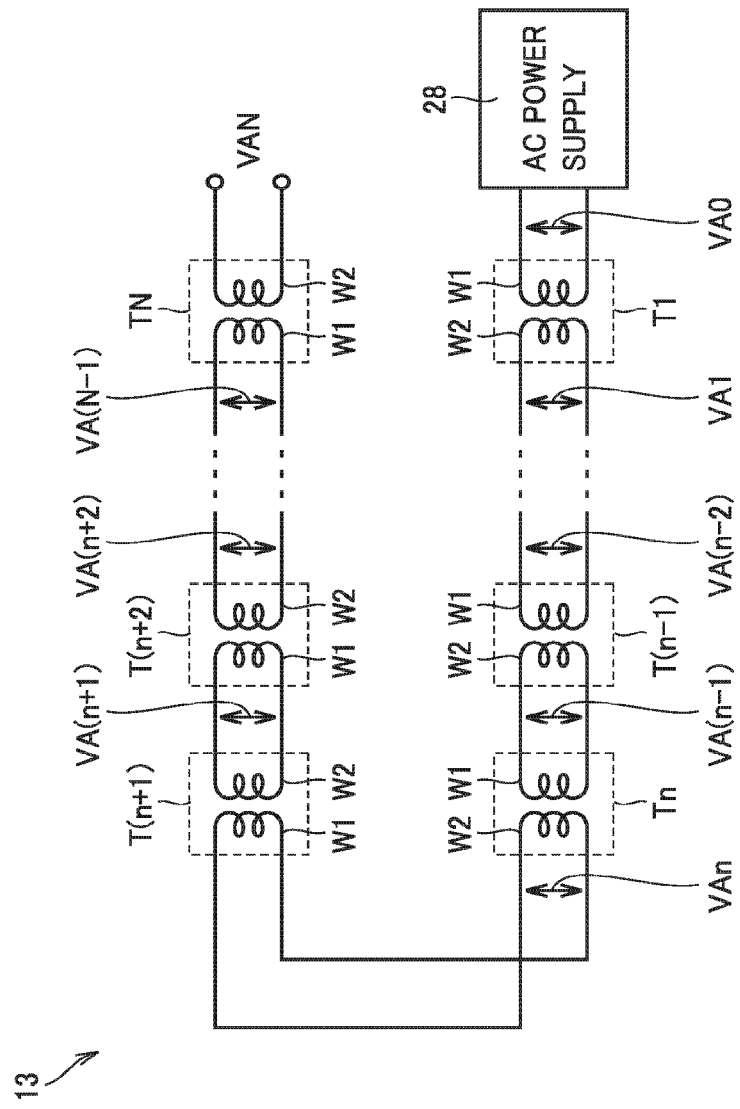
FIG. 7 is a circuit block diagram illustrating the configuration of an AC voltage generator illustrated in FIG. 3.

FIG. 7 is a circuit block diagram illustrating the configuration of the AC voltage generator 13 illustrated in FIG. 3. As illustrated in FIG. 7, the AC voltage generator 13 includes an AC power supply 28 and N insulation transformers T1 to TN. The AC power supply 28 outputs an AC power supply voltage VA0 having a predetermined frequency f0. The frequency f0 is set in such a manner that the electric power having such frequency (for example, 10 kHz) may be transmitted by a relatively small insulation transformer.

The AC power supply voltage VA0 output from the AC power supply 28 is applied to the primary winding W1 of the isolation transformer T1. Since the secondary winding W2 of each of the isolation transformers T1 to T (N−1) is respectively coupled to the primary winding W1 of each of the isolation transformers T2 to TN, the AC voltages VA1 to VAN are output from the secondary winding W2 of each of the insulation transformers T1 to TN, respectively.

Since the ratio of the number of turns of the secondary winding W2 to the number of turns of the primary winding W1 in each of the isolation transformers T1 to TN is 1, the transformation ratio between the isolation transformers T1 to T0 is 1. Therefore, the AC power supply voltage VA0 has the same magnitude as each of the AC voltages VA1 to VAN.

Referring back to FIG. 3, the DC voltage generator 14 includes N rectifiers R1 to RN. The rectifiers R1 to RN receive the AC voltages VA1 to VAN, respectively, and output DC voltages VD1 to VDN, respectively. The rectifier R1 rectifies the AC voltage VA1 to generate the DC voltage VD1. Each of the other rectifiers R2 to RN is the same as the rectifier R1.

The driver 15 includes N switching circuits S1 to SN. Each of the switching circuits S1 to SN is connected between the gate and the emitter of each of the IGBTs Q1 to QN, and configured to receive the DC voltages VD1 to VDN, respectively. The switching circuits S1 to SN are connected to the control unit 12 via the optical fibers FA1 to FAN, respectively, and connected to the control unit 12 via the optical fibers FB1 to FBN, respectively.

In response to the optical signal $\alpha 1$ from the optical fiber FA1, the switching circuit S1 applies the DC voltage VD1 between the gate and the emitter of the IGBT Q1 so as to turn on the IGBT unit U1. On the other hand, in response to the optical signal $\beta 1$ from the optical fiber FB1, the switching circuit S1 connects the gate and the emitter of the IGBT Q1 so as to turn off the IGBT unit U1. Each of the other switching circuits S2 to SN is the same as the switching circuit S1.

Thus, when the optical signals α1 to αN are output from the control unit 12, the switch 2 (composed of the IGBT units U1 to UN) is turned on, and when the optical signals β1 to βN are output from the control unit 12, the switch 2 (composed of the IGBT units U1 to UN) is turned off.

Figure 8:
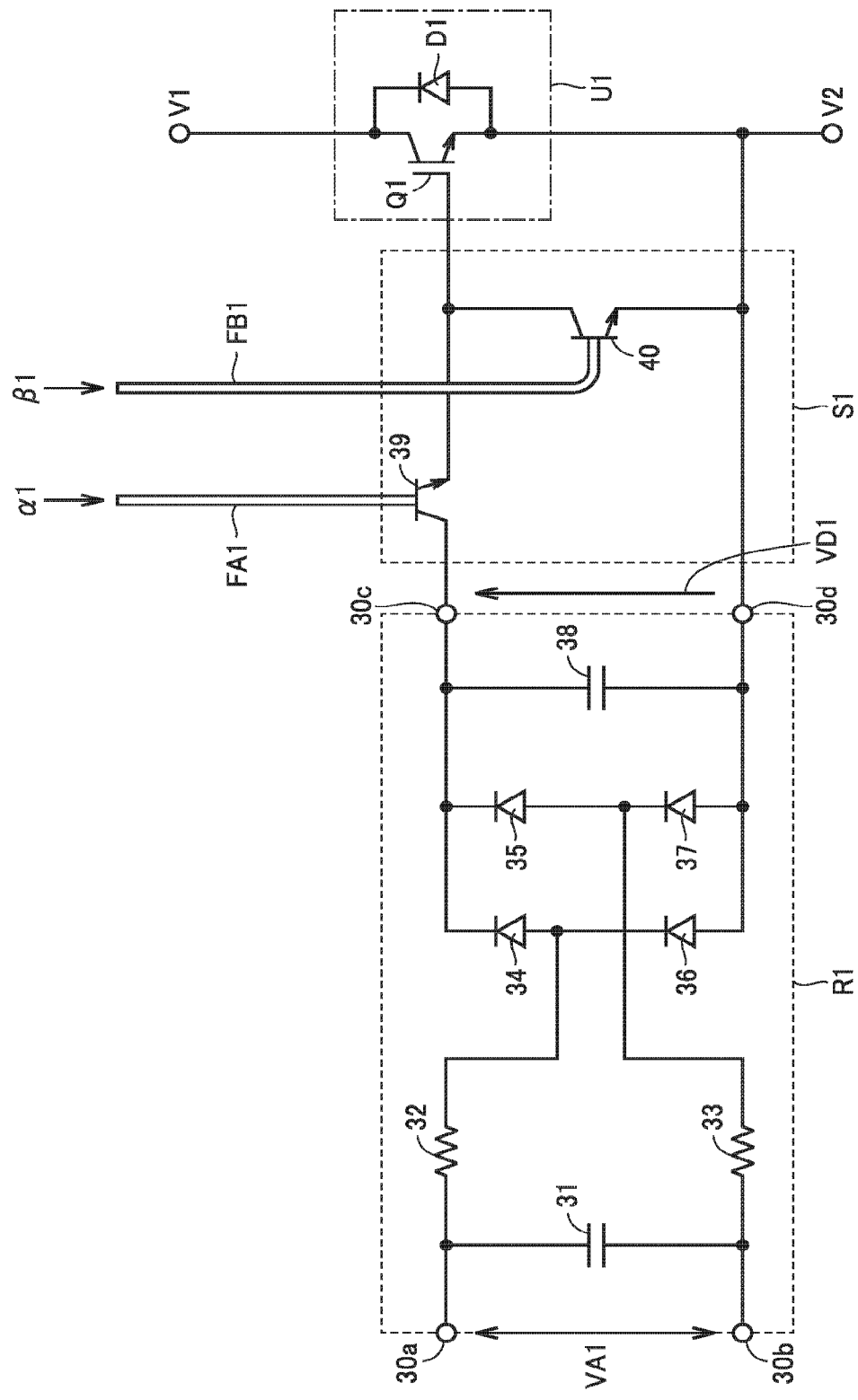
FIG. 8 is a circuit diagram illustrating the configuration of a rectifier and a switching circuit illustrated in FIG. 3.

FIG. 8 is a circuit diagram illustrating the configuration of the rectifier R1 and the switching circuit S1 illustrated in FIG. 3. As illustrated in FIG. 8, the rectifier R1 includes input terminals 30a and 30b, output terminals 30c and 30d, capacitors 31 and 38, resistors 32 and 33, and diodes 34 to 37, and the switching circuit S1 includes optical transistors 39 and 40.

The input terminals 30a and 30b of the rectifier R1 receive the AC voltage VA1 from the secondary winding W2 of the corresponding insulation transformer T1. The capacitor 31 is connected between the input terminals 30a and 30b and is called a matching capacitor. The capacitance value of the capacitor 31 is defined in such a manner that the magnitudes of the AC output voltages VA1 to VAN for the insulation transformers T1 to TN are equal to each other.

The resistor 32 has one terminal connected to the input terminal 30a and the other terminal connected to the anode of the diode 34, and the resistor 33 has one terminal connected to the input terminal 30b and the other terminal connected to the anode of the diode 35. The resistors 32 and 33 adjust the input current of the rectifier R1.

The cathode of the diode 34 and the cathode of the diode 35 are both connected to the output terminal 30c. The anode of the diode 36 and the anode of the diode 37 are both connected to the output terminal 30d, the cathode of the diode 36 is connected to the anode of the diode 34, and the cathode of the diode 37 is connected to the anode of the diode 35. The diodes 34 to 37 constitute a full-wave rectifier circuit which converts the AC voltage VA1 into the DC voltage VD1. The capacitor 38 smooths and stabilizes DC voltage VD1.

The collector of the optical transistor 39 is connected to the output terminal 30c of the rectifier R1, the emitter thereof is connected to the gate of the IGBT Q1, and the base thereof is connected to the output end of the optical fiber FA1. When the optical signal α1 is output from the control unit 12 (FIG. 3) (when the commercial AC power supply 5 is healthy), the optical transistor 39 is turned on, and when the output of the optical signal α1 is stopped (when the commercial AC power supply 5 is failed), the optical transistor 39 is turned off.

The collector of the optical transistor 40 is connected to the gate of the IGBT Q1, the emitter thereof is connected to the emitter of the IGBT Q1, and the base thereof is connected to the output end of the optical fiber FB1. When the optical signal β1 is output from the control unit 12 (FIG. 3) (when the commercial AC power supply 5 is failed), the optical transistor 40 is turned on, and when the output of the optical signal β1 is stopped (when the commercial AC power supply 5 is healthy), the optical transistor 40 is turned off. Each of the other rectifiers R2 to RN is the same as the rectifier R1, and each of the other switching circuits S2 to SN is the same as the switching circuit S1.

Next, the operation of the controller 4 illustrated in FIGS. 3 to 8 will be described. As illustrated in FIG. 3, the instantaneous value of the AC voltage VI supplied from the commercial AC power supply 5 is detected by the voltage detector 10, and based on the detection result, the power failure detector 11 determines whether or not the AC voltage VI is normally supplied from the commercial AC power supply 5.

When the AC voltage VI is normally supplied from the commercial AC power supply 5 (when the commercial AC power supply 5 is healthy), the signal PC output from the power failure detector 11 is set to the "H" level. When the AC voltage VI is not normally supplied from the commercial AC power supply 5 (when the commercial AC power supply 5 is failed), the signal PC output from the power failure detector 11 is set to the "L" level.

As illustrated in FIG. 4, the signal PC is directly supplied to the light emitters 22 and 24 and is also supplied to the delay circuit 20. The delay circuit 20 generates the signal PC1 by delaying the falling edge of the signal PC by a predetermined time Td. The signal PC1 is supplied to the light emitters 23 and 25.

When the signal PC is set to the "H" level, the light emitters 22 and 23 output the light signals α1 to αN, and the light emitters 24 and 25 stop outputting the optical signals β1 to βN. When the signal PC falls from the "H" level to the "L" level, the light emitter 22 stops outputting the optical signals α1 to αn, and after the predetermined time Td, the light emitter 23 stops outputting the optical signals α(n+1) to αN. Meanwhile, when the signal PC falls from the "H" level to the "L" level, the light emitter 24 outputs the light signals β1 to βn, and after the predetermined time Td, the light emitter 25 outputs the light signals β(n+1) to βN.

Further, as illustrated in FIG. 7, the AC power supply voltage VA0 from the AC power supply 28 is applied to the primary winding W1 of the insulation transformer T1. The insulation transformers T1 to TN are sequentially connected, and the AC voltages VA1 to VAN are output from the secondary windings W2 of the insulation transformers T1 to TN, respectively.

As illustrated in FIG. 3, the AC output voltages VA1 to VAN of the isolation transformers T1 to TN are supplied to the rectifiers R1 to RN, respectively. For example, as illustrated in FIG. 8, the AC voltage VA1 is applied between the input terminals 30a and 30b of the rectifier R1.

When the AC voltage VA1 is positive, a current flows from the input terminal 30a, passing through the resistor 32, the diode 34, the capacitor 38, the diode 37 and the resistor 33, into the input terminal 30b, whereby the capacitor 38 is charged.

When the AC voltage VA1 is negative, a current flows from the input terminal 30b, passing through the resistor 33, the diode 35, the capacitor 38, the diode 36 and the resistor 32, into the input terminal 30a, whereby the capacitor 38 is charged. Accordingly, the DC voltage VD1 is generated between the terminals of the capacitor 38. The DC voltage VD1 is applied to the switching circuit S1.

Similarly, the AC voltages VA2 to VAN are converted to the DC voltages VD2 to VDN by the rectifiers R2 to RN and applied to the switching circuits S2 to SN.

When the commercial AC power supply 5 (FIG. 1) is healthy, the control unit 12 (FIG. 4) outputs the optical signals α1 to αN and stops outputting the optical signals β1 to βN, whereby the optical transistor 39 in each of the switching circuits S1 to SN is turned on and the optical transistor 40 in each of the switching circuits S1 to SN is turned off. Thus, each of the DC voltages VD1 to VDN is applied between the gate and the emitter of each of the IGBTs Q1 to QN via the optical transistor 39 of each of the switching circuits S1 to SN, and thereby, the IGBT units U1 to UN (in other words, the switch 2) are turned on.

When the commercial AC power supply 5 is failed, the control unit 12 (FIG. 3) stops outputting the optical signals α1 to αn and outputs the optical signals β1 to βn, and after the predetermined time Td, the control unit 12 stops outputting the optical signals α(n+1) to αN and outputs the optical signals β(n+1) to βN.

When the output of the optical signals α1 to αn is stopped and the optical signals β1 to βn are output, the optical transistor 40 in each of the switching circuits S1 to Sn is turned on, and the optical transistor 39 in each of the switching circuits S1 to Sn is turned off. Thereby, the gate and the emitter of each of the IGBTs Q1 to Qn are connected by the optical transistor 40 in each of the switching circuits S1 to Sn, and thus, the IGBT units U1 to Un are turned off.

When the output of the optical signals α(n+1) to αN is stopped and the optical signals β(n+1) to βN are output after the predetermined time Td, the optical transistor 40 in each of the switching circuits S(n+1) to SN is turned on, and the optical transistor 39 in each of the switching circuits S(n+1) to SN is turned off. As a result, the gate and the emitter of each of the IGBTs Q (n+1) to QN are connected by the optical transistor 40 in each of the switching circuits S(n+1) to SN, and thus, the IGBT units U(n+1) to UN are turned off. Consequently, the switch 2 is completely turned off.

As described above, in the first embodiment, at the time of turning off the switch 2, the IGBT units U1 to Un are firstly turned off and then the IGBT units U(n+1) to UN are turned off. Therefore, compared to the case where the IGBT units U1 to UN are turned off at the same time, it is possible to reduce the surge voltage generated between the terminals of switch 2, which makes it possible to lengthen the service life of the surge absorber 1. Moreover, since it is not necessary to wait until the alternating current flowing through the switch 2 reaches the zero point, it is possible to turn off the switch 2 quickly.

Second Embodiment

Figure 9:
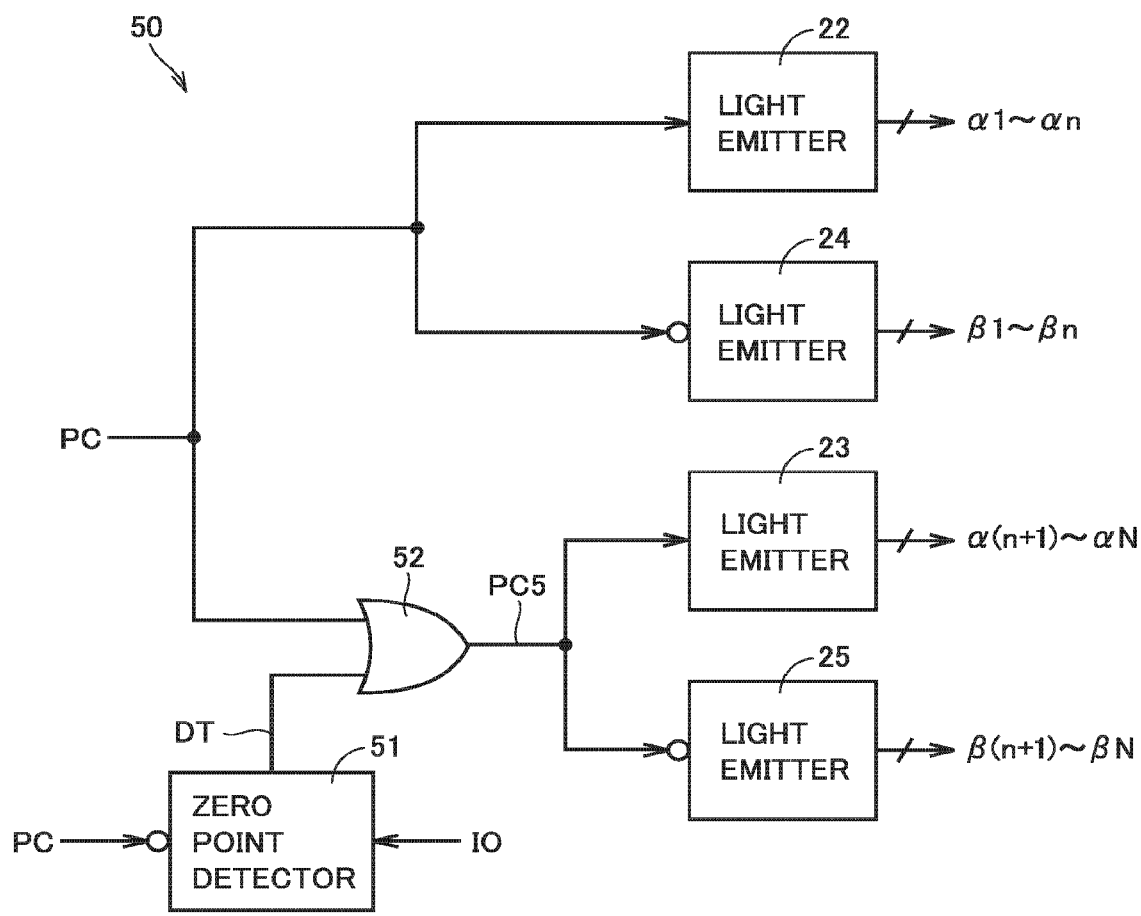
FIG. 9 is a circuit block diagram illustrating a main part of an uninterruptible power supply device according to a second embodiment.

FIG. 9 is a circuit block diagram illustrating a main part of an uninterruptible power supply device according to a second embodiment of the present invention, and is a diagram for comparison with FIG. 4. Referring to FIG. 9, the uninterruptible power supply device according to the present embodiment is different from the uninterruptible power supply device according to the first embodiment in that the control unit 12 is replaced with a control unit 50. The control unit 50 is obtained by replacing the delay circuit 20 of the control unit 12 with a zero-point detector 51 and an OR gate 52.

The zero-point detector 51 is activated when the signal PC output from the power failure detector 11 (FIG. 3) is at the "L" level. The zero-point detector 51 detects a zero point of the AC output current IO based on a signal output from the current detector CT (FIG. 1), and outputs a signal DT indicating the detection result. At the zero point of the AC output current IO, the instantaneous value of the AC output current IO is 0 A.

When the signal PC is at the "H" level, the signal DT is fixed at the "H" level. When the signal PC is at the "L" level, the signal DT falls from the "H" level to the "L" level in response to the detection of the zero point of the AC output current IO. The OR gate 52 outputs a signal PC5 which is a logical sum of the signals PC and DT to the light emitters 23 and 25.

FIG. 10 is a time chart illustrating the operation of the control unit 50 illustrated in FIG. 9. Specifically, FIG. 10(A) illustrates the waveform of the signal PC output from the power failure detector 11 (FIG. 3), FIG. 10(B) illustrates the waveform of the signal DT output from the zero detector 51 (FIG. 9), and FIG. 10(C) illustrates the waveform of the signal PC5 output from the OR gate 52 (FIG. 9).

FIG. 10(D) illustrates the waveform of the signals α1 to αn output from the light emitter 22 (FIG. 8), and FIG. 10(E) illustrates the waveform of the signals α(n+1) to αN output from the light emitter 23 (FIG. 8). FIG. 10(F) illustrates the waveform of the signals β1 to βn output from the light emitter 24 (FIG. 8), and FIG. 10(G) illustrates the waveform of the signals β(n+1) to ON output from the light emitter 25 (FIG. 8).

As illustrated in FIG. 10, at timing t0, the AC voltage VI is normally supplied from the commercial AC power supply 5, the signal PC is set to the "H" level, and the signal DT output from the zero detector 51 and the signal PC5 output from the OR gate 52 are both set to the "H" level. As a result, the optical signals α1 to αN are output from the light emitters 22 and 23, and the output of the optical signals β1 to βN from the light emitters 24 and 25 is stopped, whereby the IGBT units U1 to UN are turned on.

When a power failure occurs at timing t1, the signal PC falls from the "H" level to the "L" level. As a result, the output of the optical signals α1 to αn from the light emitter 22 is stopped, and the optical signals β1 to βn are output from the light emitter 24, whereby the IGBT units U1 to Un are turned off.

Next, at timing t2, when the zero point of the AC output current IO is detected by the zero-point detector 51, the signal DT output from the zero-point detector 51 falls from the "H" level to the "L" level, and the signal PC5 falls from the "H" level to the "L" level. As a result, the output of the optical signals α(n+1) to αN from the light emitter 23 is stopped, and the optical signals β(n+1) to βN are output from the light emitter 25, whereby the IGBT units U(n+1) to UN are turned off.

Next, when the commercial AC power supply 5 is restored to the healthy state at timing t3, the signals DT, PC and PC5 all rise from the "L" level to the "H" level. As a result, the optical signals α1 to αN are output from the light emitters 22 and 23, and the output of the optical signals β1 to βN from the light emitters 24 and 25 is stopped, whereby the IGBT units U1 to UN are turned on.

Since the other configurations and operations are the same as those in the first embodiment, the description thereof will not be repeated. In the second embodiment, the same effects as those in the first embodiment can be obtained.

The embodiments disclosed herein are merely by way of example and not limited thereto. The scope of the present invention is defined by the terms of the claims, rather than the description above, and is intended to include any modifications within the meaning and scope equivalent to the terms of the claims.

REFERENCE SIGNS LIST

TI: AC input terminal; TO: AC output terminal; TB: battery terminal; 1: surge absorber; 2: switch; CT: current detector; 3: bidirectional converter; 4: controller; 5: commercial AC power supply; 6: load; 7: battery; Q1 to QN, QiA, QiB, IGBT, D1 to DN, 34 to 37: diode; SN1 to SNN: snubber circuit; U1 to UN: IGBT unit; 10: voltage detector; 11: power failure detector; 12, 50: control unit; FA1 to FAN, FB1 to FBN: optical fiber; 13: AC voltage generator; 14: DC voltage generator; 15: driver; R1 to RN: rectifier; S1 to SN: switching circuit; 20: delay circuit; 22 to 25: light emitter; 26: inverter; 27, 52: OR gate; 28: AC power supply; T1 to TN: insulation transformer; W1: primary winding; W2: secondary winding; 31, 38: capacitor; 32, 33: resistor; 39, 40: optical transistor; 51: zero-point detector

The invention claimed is:

1. A power supply device comprising:
a switch including a plurality of switching elements that are connected in series between a first terminal and a second terminal, the plurality of switching elements being divided into a first group and a second group; and
a controller that turns on the switch by turning on the plurality of switching elements, and turns off the switch by firstly turning off the switching elements in the first group and then turning off the switching elements in the second group.

2. The power supply device according to claim 1, wherein the number of the switching elements in the first group is defined in such a manner that the total withstand voltage of the switching elements in the first group is greater than a voltage generated between the first terminal and the second terminal.

3. The power supply device according to claim 1, wherein the switch further includes a snubber circuit that is provided for each of the plurality of switching elements and is connected in parallel to a corresponding switching element so as to protect the corresponding switching element from a surge voltage.

4. The power supply device according to claim 3, wherein the snubber circuit includes a resistor whose resistance value changes in response to a voltage between the terminals of the resistor,
the number of the snubber circuits is defined in such a manner that a current flowing through the resistor is equal to or less than a predetermined reference current when the switch is off.

5. The power supply device according to claim 1, wherein each of the plurality of switching elements is a transistor, the switch further includes a plurality of diodes, each of which is connected in anti-parallel to each of the plurality of transistors.

6. The power supply device according to claim 1, further comprising a surge absorber that is connected to the first terminal to protect the power supply device from a surge voltage.

7. The power supply device according to claim 6, wherein when each switching element is turned off, a surge voltage is generated between electrodes of the switching element,
the service life of the surge absorber is shortened as the surge voltage generated at the first terminal becomes greater, and
the surge voltage generated at the first terminal is reduced by firstly turning off the switching elements in the first group and then turning off the switching elements in the second group.

8. The power supply device according to 1, wherein the controller turns off the switch by firstly turning off the switching elements in the first group and then turning off the switching elements in the second group after a predetermined time.

9. The power supply device according to claim 1, wherein the first terminal receives AC power supplied from an AC power supply,
the second terminal is connected to a load driven by the AC power,
the power supply device further includes a current detector that detects an instantaneous value of an alternating current flowing from the power supply device through the load, and
the controller turns off the switch by firstly turning off the switching elements in the first group, and then turning off the switching elements in the second group when the detection value by the current detector is 0 A.

10. The power supply device according to claim 1, wherein
the first terminal receives AC power supplied from an AC power supply,
the second terminal is connected to a load driven by the AC power,
the controller turns on the switch in a first case where an AC voltage is normally supplied from the AC power supply, and turns off the switch in a second case where the AC voltage is not normally supplied from the AC power supply,
the power supply device further includes a bidirectional converter connected to the second terminal, and
the bidirectional converter coverts the AC power supplied from the AC power supply via the switch into DC power and stores the DC power in a power storage device in the first case, and coverts the DC power from the power storage device into AC power and supplies the AC power to the load in the second case.

* * * * *